United States Patent
Breil et al.

(10) Patent No.: US 9,496,329 B2
(45) Date of Patent: Nov. 15, 2016

(54) DT CAPACITOR WITH SILICIDE OUTER ELECTRODE AND/OR COMPRESSIVE STRESS LAYER, AND RELATED METHODS

(71) Applicant: International Business Machines Corporation, Armonk, NY (US)

(72) Inventors: Nicolas L. Breil, Wappingers Falls, NY (US); Ricardo A. Donaton, Cortlandt Manor, NY (US); Dong Hun Kang, Hopewell Junction, NY (US); Herbert L. Ho, New Windsor, NY (US); Rishikesh Krishnan, Painted Post, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/831,504

(22) Filed: Aug. 20, 2015

(65) Prior Publication Data

US 2015/0357403 A1  Dec. 10, 2015

Related U.S. Application Data

(62) Division of application No. 14/242,092, filed on Apr. 1, 2014.

(51) Int. Cl.
*H01L 27/108* (2006.01)
*H01L 49/02* (2006.01)
*H01L 21/283* (2006.01)

(52) U.S. Cl.
CPC ............ *H01L 28/91* (2013.01); *H01L 21/283* (2013.01); *H01L 27/1082* (2013.01); *H01L 27/1087* (2013.01); *H01L 27/10832* (2013.01); *H01L 27/10858* (2013.01); *H01L 27/10867* (2013.01); *H01L 28/90* (2013.01)

(58) Field of Classification Search
CPC .................. H01L 27/1203; H01L 21/76232
See application file for complete search history.

(56) References Cited

U.S. PATENT DOCUMENTS

| | | | |
|---|---|---|---|
| 6,294,420 B1 | 9/2001 | Tsu et al. | |
| 6,448,131 B1 | 9/2002 | Cabral, Jr. et al. | |
| 6,528,384 B2 | 3/2003 | Beckmann et al. | |
| 6,664,161 B2 | 12/2003 | Chudzik et al. | |
| 6,949,431 B2 | 9/2005 | Lee | |
| 7,638,389 B2 | 12/2009 | Ahn | |
| 8,470,668 B2 | 6/2013 | Cho et al. | |
| 8,487,405 B2 * | 7/2013 | Tian | H01L 27/0805 257/532 |
| 8,723,243 B2 | 5/2014 | Messenger et al. | |

(Continued)

OTHER PUBLICATIONS

Stevenson, Office Action Communication for U.S. Appl. No. 14/242,092 dated Jul. 7, 2015, 15 pages.

(Continued)

*Primary Examiner* — Zandra Smith
*Assistant Examiner* — Andre' C Stevenson
(74) *Attorney, Agent, or Firm* — Steven J. Meyers; Hoffman Warnick LLC

(57) ABSTRACT

A deep trench capacitor is provided. The deep trench capacitor may include: a deep trench in a substrate, the deep trench including an lower portion having a width that is wider than a width of the rest of the deep trench; a compressive stress layer against the substrate in the lower portion; a metal-insulator-metal (MIM) stack over the compressive stress layer, the MIM stack including a node dielectric between an inner electrode and an outer electrode; and a semiconductor core within the MIM stack.

4 Claims, 9 Drawing Sheets

(56) References Cited

U.S. PATENT DOCUMENTS

| | | |
|---|---|---|
| 2001/0055846 A1 | 12/2001 | Beckmann et al. |
| 2003/0129805 A1 | 7/2003 | Kim |
| 2003/0148580 A1 | 8/2003 | Chen et al. |
| 2008/0067568 A1* | 3/2008 | Abbasi ............... H01L 27/1087 257/301 |
| 2008/0182361 A1* | 7/2008 | Horton .............. H01L 23/49822 438/109 |
| 2012/0196424 A1 | 8/2012 | Krishnan et al. |
| 2013/0285193 A1 | 10/2013 | Barth, Jr. et al. |
| 2014/0120687 A1 | 5/2014 | Cao et al. |

OTHER PUBLICATIONS

Notice of Allowance and Fee(s) Due for U.S. Appl. No. 14/242,092, dated Dec. 10, 2015, 8 pages.

Office Action for U.S. Appl. No. 14/831,487, dated Nov. 19, 2015, 12 pages.

* cited by examiner

DT CAPACITOR WITH SILICIDE OUTER ELECTRODE AND/OR COMPRESSIVE STRESS LAYER, AND RELATED METHODS

BACKGROUND

1. Technical Field

The present disclosure relates to deep trench capacitors, and more specifically, to a deep trench capacitor with a lower portion that is wider than a width of the rest of the deep trench, and a compressive stress layer in the lower portion and/or a silicide outer electrode.

2. Related Art

Deep trench capacitors are used widely in integrated circuit chips to provide embedded dynamic random access memory (eDRAM). Information or data is stored in the memory cell in the form of charge accumulated on the capacitor. Because capacitors leak charge (generally, a capacitor is only useful for temporarily storing an electrical charge), the information (data) eventually fades unless the capacitor charge is refreshed (read, and re-written) periodically, such as every 256 microseconds. A deep trench "DT" capacitor generally comprises a first conductive electrode called the "buried plate" which is a heavily doped region of the substrate surrounding the deep trench, a thin layer of insulating material such as an oxide lining the deep trench, and a second conductive electrode such as a heavily doped polycrystalline plug (or "node") disposed within the deep trench. The transistor may also include a field effect transistor (FET) having one of its source/drain (S/D) terminals connected to (or an extension of) the second electrode (node) of the capacitor.

FIG. 1 illustrates a DRAM cell 100 of the prior art, and generally comprising an access transistor and an associated cell capacitor. The DRAM cell is generally formed (created), as follows. Beginning with a semiconductor substrate 102, a deep trench (DT) 110 is formed, extending into substrate 102, from a top (as viewed) surface thereof. Substrate 102 may comprise a semiconductor-on-insulator (SOI) substrate having a layer 106 of silicon (SOI) on top of an insulating layer 104 which is atop the underlying silicon substrate 102. However, a bulk substrate may also be employed. Insulating layer 104 typically comprises buried oxide (BOX). Deep trench (DT) 110 is used for forming the cell capacitor (or "DT capacitor"). At current technology nodes, the deep trench 110 may have a width of about 50 nm to 200 nm and a depth of 1000 nm to 10000 nm, by way of example.

The cell capacitor generally comprises a first conductor or electrode called the "buried plate" which is a heavily doped region 112 of the substrate surrounding deep trench 110, a thin layer 114 of an insulating material lining deep trench 110, and a second conductor or electrode 116 such as a heavily doped polycrystalline plug (or "node", "DT poly") disposed within deep trench 110.

A cell transistor ("access transistor") 120 may comprise a FET having one of its source/drain (S/D) terminals connected to (or an extension of) the second conductor (node) of the capacitor. FET 120 may comprise two spaced-apart diffusions 122, 124, within the surface of the substrate 102—one of which will serve as the "source" (S) and the other of which will serve as the "drain" (D) of transistor 120. A space between the two diffusion areas is called the "channel" (and is approximately where the legend "SOI" appears). A thin dielectric layer 126 is disposed on the substrate above the channel, and a "gate" structure (G) 128 is disposed over the dielectric layer 126, thus also atop the channel. (The dielectric under the gate is also commonly referred to as "gate oxide" or "gate dielectric".) Gate 128 may be a portion of an elongate wordline (WL).

In modern CMOS technology, a shallow deep trench isolation (STI) is commonly used to isolate one (or more) transistors from other transistors, for both logic and memory. As shown in FIG. 1, a shallow deep trench 132 may be formed, surrounding access transistor 120 (only one side of the transistor is shown). Note that deep trench 132 extends over DT (node) poly 116, a top portion of which is adjacent the drain (D) of transistor 120. Therefore, deep trench 132 is less deep (thinner) over DT poly 116 and immediately adjacent the drain (D) of the transistor 120, and may be deeper (thicker) further from drain (D) of transistor 120 (and, as shown, over top portion of the DT poly 116 which is distal from (not immediately adjacent to) the drain (D) of the transistor 120). STI deep trench 132 may be filled with an insulating material, such as oxide (STI oxide) 134. Because of the thin/thick deep trench geometry which has been described, the STI oxide will exhibit a thin portion 134a where it is proximal (adjacent to) the drain (D) of the transistor 120, and a thicker portion 134b where it is distal from (not immediately adjacent to) the drain (D) of the transistor 120.

Although not shown, the deep trench (DT) may be "bottle-shaped", such that it is wider in substrate 102 under BOX 104, and a thinner bottleneck portion of the deep trench extends through the BOX (and overlying SOI, not shown). The deep trench is typically filled with poly (DT Poly, compare 116), there is a lining of insulator (compare 114), and the deep trench is surrounded by the buried plate (compare 112). This forms the deep trench capacitor, which is generally not limited to SOI.

One form of deep trench capacitor is referred to as a metal-insulator-metal (MIM) due to the different types of layers used to form the capacitor. As described above, each metal layer creates a conductor or electrode either alone or in combination with surrounding structure. Each electrode is preferably sized to create as much capacitive capability as possible within each capacitor, i.e., the more surface area, the better the capacitive capabilities.

An outer or bottom electrode 140, which is approximately between insulator 110 and electrically joined with buried plate 112 may be formed in a number of ways. In one option, outer electrode 140 includes a deposited metal, e.g., tungsten, titanium, tantalum, ruthenium, cobalt, copper, aluminum, in the deep trench to couple to buried plate 112 of substrate 102. One challenge with using a deposited metal, however, is that residual oxides are created during the process that may degrade the overall capacitance at advanced technology nodes. That is, the residual oxide reduces the surface area of the outer electrode, diminishing its capabilities. The residual oxide may also degrade high frequency operation due to additional resistance from the oxide.

In order to address this situation, an alternative process may include forming a silicide, i.e., a silicon-metal conducting compound, in the deep trench. Unfortunately, current integrated circuit chip technology nodes (e.g., 22 nm and beyond) present a challenge in that a residual tensile stress is typically present after silicide formation due to the different coefficient of thermal expansion (CTE) between silicide and substrate 102. In smaller technology nodes, the impact of this residual tensile stress is magnified. The residual stress prevents successful formation of the silicide. Consequently, further scaling of integrated circuit chips may be hindered by the inability to scale the outer electrode of deep trench capacitors.

SUMMARY

A first aspect of the disclosure is directed to a method of forming a deep trench capacitor, the method comprising: forming a deep trench in a substrate; enlarging a width of a lower portion of the deep trench to be wider than a width of the rest of the deep trench; epitaxially forming a compressive stress layer in the lower portion of the deep trench; forming a metal-insulator-metal (MIM) stack within the lower portion of the deep trench; and filling a remaining portion of the deep trench with a semiconductor.

A second aspect of the disclosure includes a method of forming a deep trench capacitor, the method comprising: forming a deep trench in a substrate; forming a metal-insulator-metal (MIM) stack within a portion of the deep trench, the MIM stack forming including forming an outer electrode by co-depositing a refractory metal and silicon into the deep trench; and filling a remaining portion of the deep trench with a semiconductor.

A third aspect of the disclosure related to a deep trench capacitor comprising: a deep trench in a substrate, the deep trench including an lower portion having a width that is wider than a width of the rest of the deep trench; a compressive stress layer against the substrate in the lower portion; a metal-insulator-metal (MIM) stack over the compressive stress layer, the MIM stack including a node dielectric between an inner electrode and an outer electrode; and a semiconductor core within the MIM stack.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

DETAILED DESCRIPTION

The present disclosure provides two approaches to addressing the challenges presented by residual oxides from metal outer electrodes and the challenges presented for silicide outer electrodes created by advanced technology nodes. The approaches may be used independently or in combination.

Figure 1:
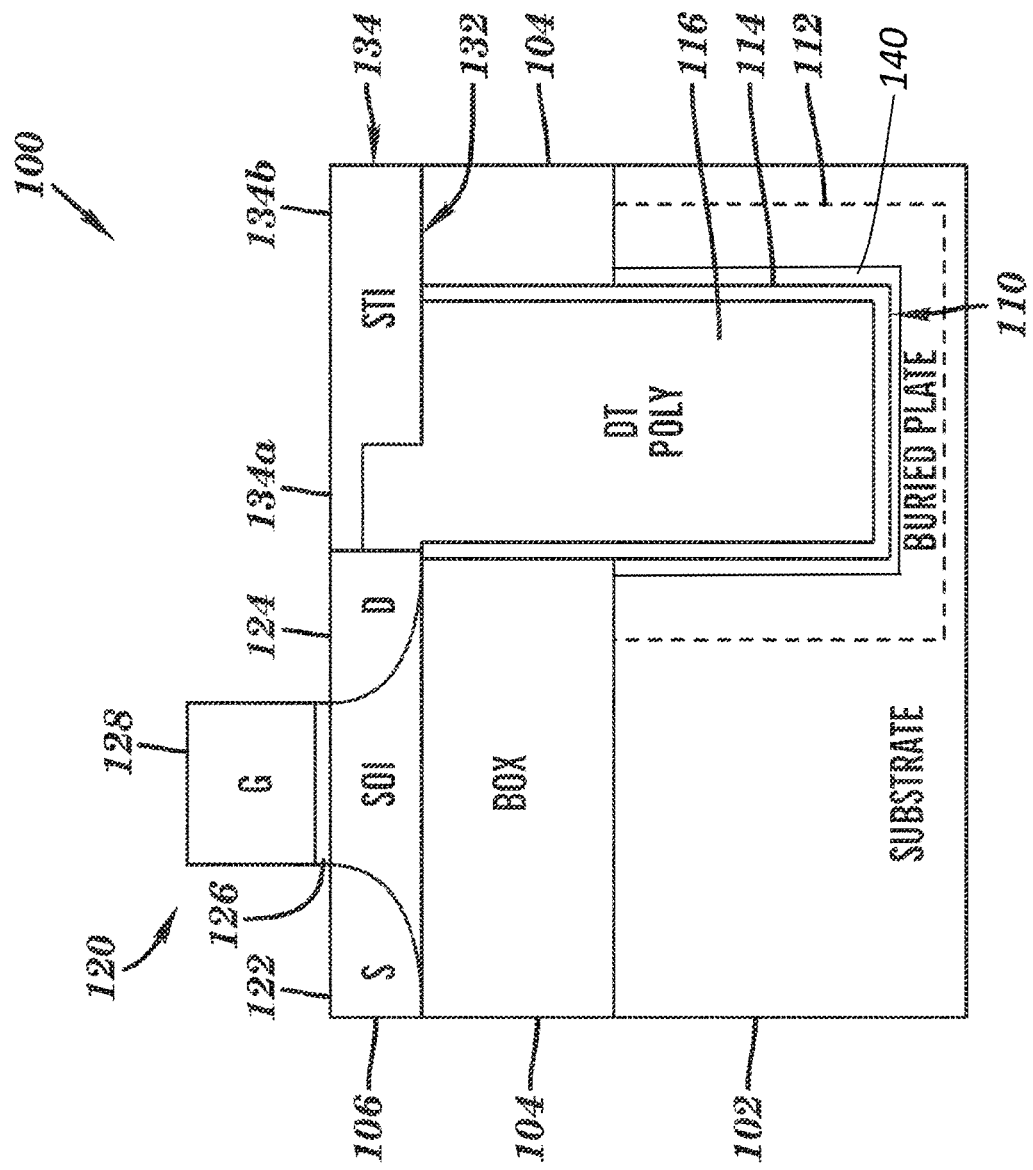
FIG. 1 is a cross-sectional view of a DRAM cell 100 and a FET 120, according to the prior art.
Figure 2:
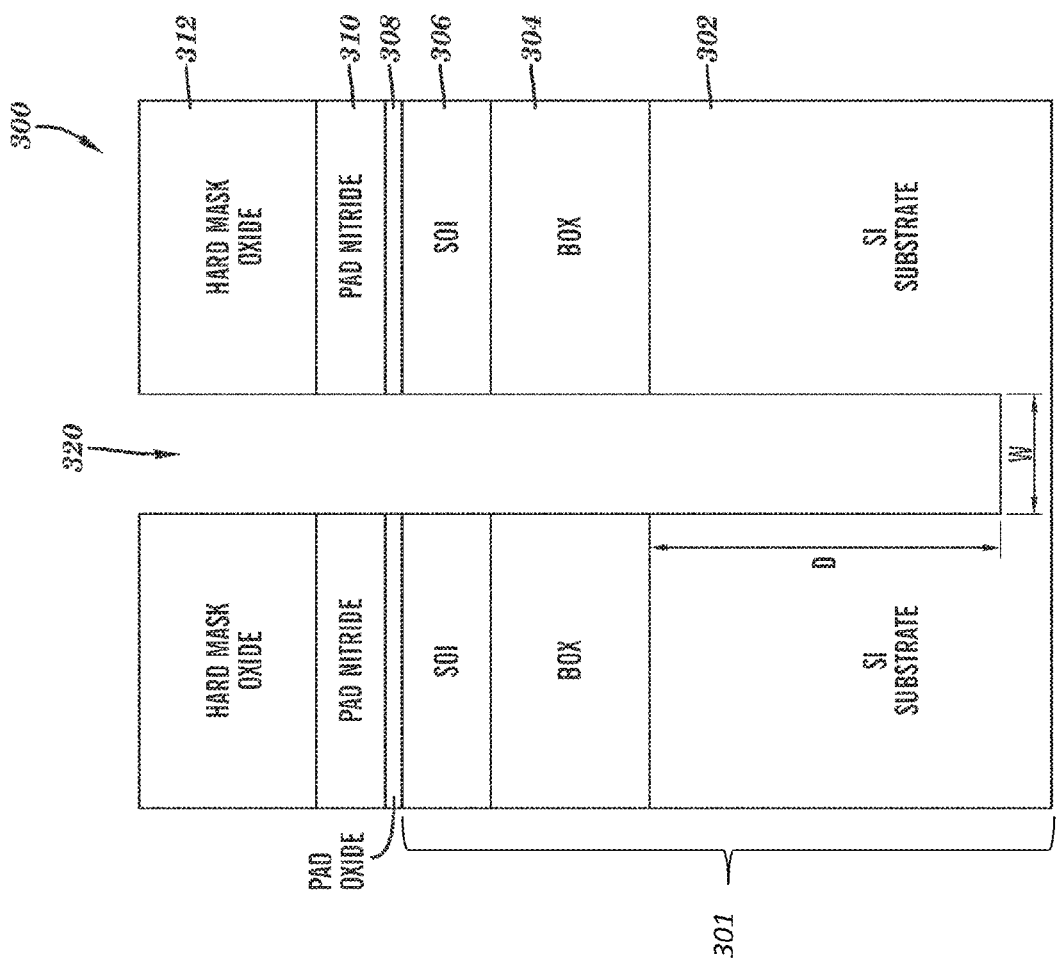
FIGS. 2-9 are cross-sectional views of various embodiments of a method of forming a deep trench capacitor according to the disclosure, with FIG. 9 showing a deep trench capacitor according to embodiments of the disclosure.

Referring to the drawings, embodiments of various methods according to the disclosure are illustrated. FIG. 2 shows first steps of forming a DT capacitor. Processing may begin with, for example, a substrate 301 with pad films 308, 310 and a hard mask 312. In this embodiment, substrate 301 includes an SOI-type substrate having a layer 306 of silicon ("SOI") atop a buried oxide (BOX, insulator) layer 304, which is atop an underlying substrate 302. BOX layer 304 may have a thickness of 500-2500 Å (50-250 nm). The silicon (SOI) layer 306 may have a thickness of 50-200 Å (5-20 nm). Although shown with regard to a standard SOI substrate in FIG. 2, as will be illustrated, the teachings of the disclosure may also be applied to a bulk substrate 301. A bulk substrate 301 (or silicon layers 302 and/or 306) may include but are not limited to silicon, germanium, silicon germanium, silicon carbide, and those materials consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. For example, silicon substrate 302 may be strained. Pad films may include a layer 308 of an oxide and a layer 310 of a nitride disposed atop SOI layer 306 (or bulk substrate 301). Pad oxide layer 308 may have a thickness of 10-20 Å (1-2 nm), and the pad nitride layer 310 may have a thickness of 400-1500 Å (40-150 nm). All of the above-described layers may be formed using any now known or later developed techniques such as deposition. "Depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), pulsed CVD, atomic layer deposition (ALD), chemical oxidation, molecular beam epitaxy (MBE), plating, evaporation.

FIG. 2 also shows a first step of forming a DT capacitor by forming a deep trench 320. In this case, a standard deep trench (DT) lithography may be performed. Generally, an opening is made in hard mask 312 by a conventional hard mask open RIE process and a subsequent deep trench RIE is performed to form deep trench 320 extending through pad nitride 310, pad oxide 308, SOI layer 306, BOX 304 and into the underlying semiconductor substrate 302. After DT etch, the hard mask may remain, or be removed by a conventional process such as a wet strip that typically uses hydrofluoric acid (HF). Deep trench 320 may be approximately cylindrical.

As shown in FIG. 2, deep trench 320 may have a depth "D" of approximately 1500 nm (+/−10%) to approximately 5000 nm (i.e., 1.5-5 microns) and a width "W" of approximately 50 nm to approximately 150 nm. Deep trench 320 is much deeper than it is wide, having (for example) an aspect ratio (D:W) in a range of approximately 25:1 to approximately 40:1. The deep trench itself may be considered to be only that part of the overall deep trench which is within substrate 302, not including the part of the deep trench which extends through BOX 304 and SOI 306, pad oxide 308, pad nitride 310, and mask 312, generally because that is where the DT capacitor will be formed. The top part of the overall deep trench, in BOX 304 and SOI 306, pad oxide 308, pad nitride 310, and mask 312 may be referred to as an extension of the deep trench, or may be included in a reference to the overall deep trench.

Figure 3:
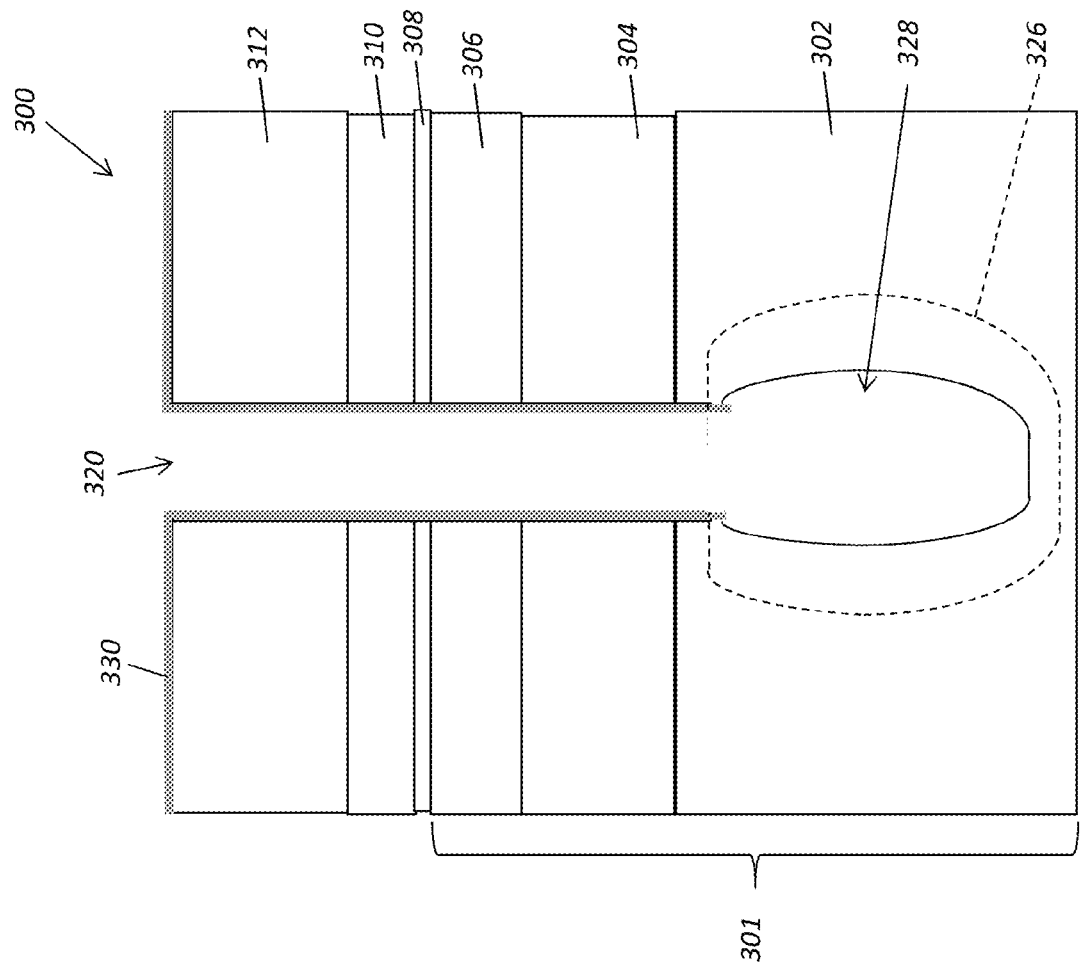

Turning to FIG. 3, enlarging a width of a lower portion 328 of deep trench 320 to be wider than a width of the rest of the deep trench is illustrated. This step may include depositing an etch resistant layer 330 over an upper portion of deep trench 320, and performing a wet etch of the lower portion. Etch resistant layer 330 may be deposited on the sidewalls inside of deep trench 320 to cover the complete sides of the layer of silicon 306 and the layer of oxide 304 and partial sides of the silicon substrate 302. The sides of substrate 302 remain uncovered. In FIG. 3, the complete sides of pad oxide 308, pad nitride 310 and hardmask 312 are covered, forming a collar. Etch resistant layer 330 is formed of any number of materials, such as HTO, nitride, HFO, or AlO, and is deposited by any conventional technique such as ALD, CVD or PVD. In the embodiment, etch resistant layer 330 has a substantially uniform thickness in a range of approximately 3 nm to approximately 30 nm. Etch resistant layer 330 functions primarily to prevent etching of the sidewalls of deep trench 320 other than in a lower portion 328 thereof. Etch resistant layer 330 blocks the areas covered by the layer, and protects the sides of the layers 312, 310, 308, 306, 304 and partial sides of substrate 302. A wet etch may be performed to etch the lower portion of the deep trench with etch resistant layer 330 in position, which results in an lower portion 328 of deep trench 320 that is wider than the rest of deep trench 320, i.e., such that it is significantly wider in substrate 302 compared to the rest of the deep trench. It is noted that this "bottle-shape" is significantly larger than what may occur naturally during formation of deep trench 320, e.g., trench with of approximately 64 nanometers. A heavily doped (n-type) buried plate 326 is shown in phantom about lower portion 328. The n-type dopant may include, for example, phosphorous (P), arsenic or antimony (Sb). As known, an n-type element generates free electron by "donating" electron to the semiconductor.

Figure 4:
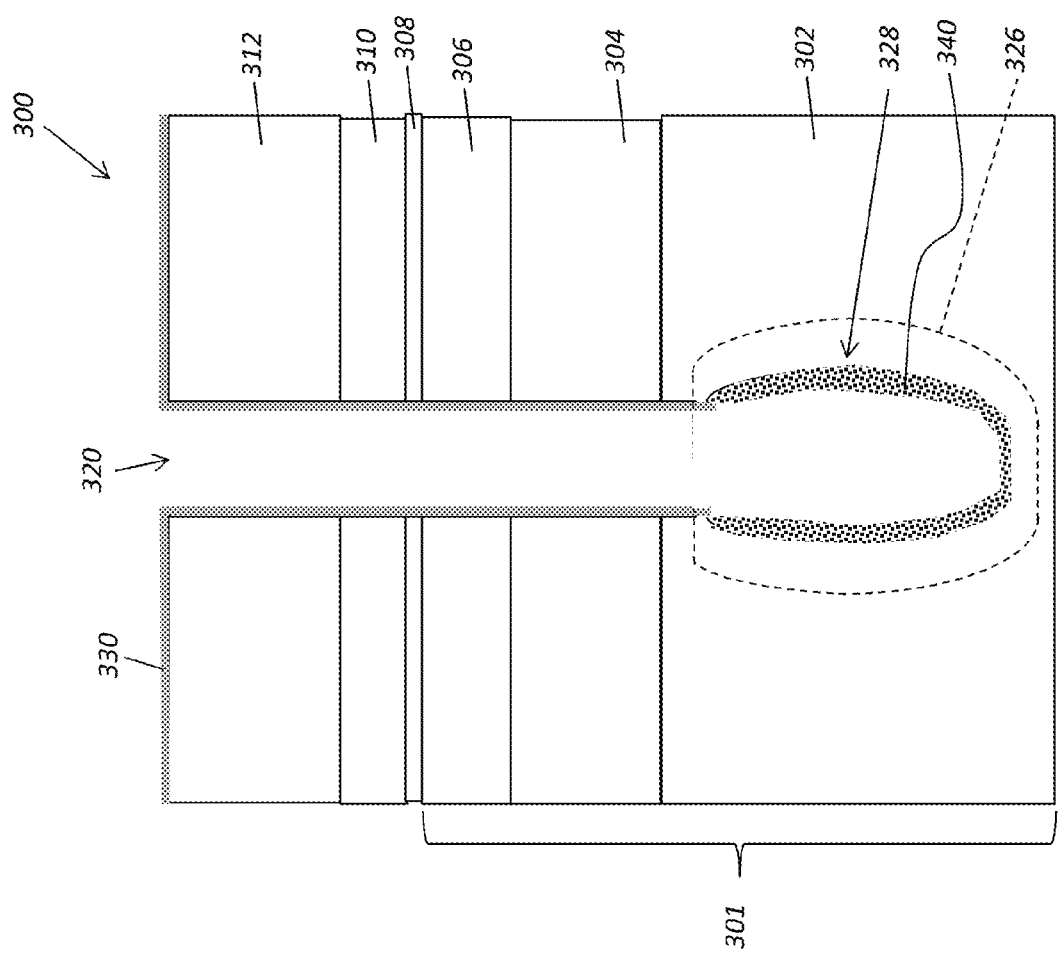

FIG. 4 shows epitaxially forming a compressive stress layer 340 in lower portion 328 of deep trench 320. In one embodiment, compressive stress layer 340 includes epitaxial silicon germanium (eSiGe). The epitaxial forming may include epitaxially growing silicon germanium on a surface of lower portion 328 of deep trench 320. In one embodiment, the eSiGe layer 340 forming may also include doping SiGe with an n-type dopant. The doping may occur, for example, using a plasma doping process or in-situ during the epitaxy process. The n-type dopant may include, for example, phosphorous (P), arsenic or antimony (Sb). Since compressive stress layer 340 is epitaxially grown, it takes on the crystalline nature of the material it is grown on, i.e., substrate 302. Consequently, it will be monocrystalline if grown on a bulk silicon substrate or polycrystalline if grown on a polysilicon substrate. The compressive stress in layer 340 acts to compensate for any later tensile stress inducing layers as part of the DT capacitor formation. For example, where compressive stress layer 340 is epitaxially grown on a bulk silicon substrate 302, it is monocrystalline like substrate 302, which aids in stress transfer thereto.

Figure 5:
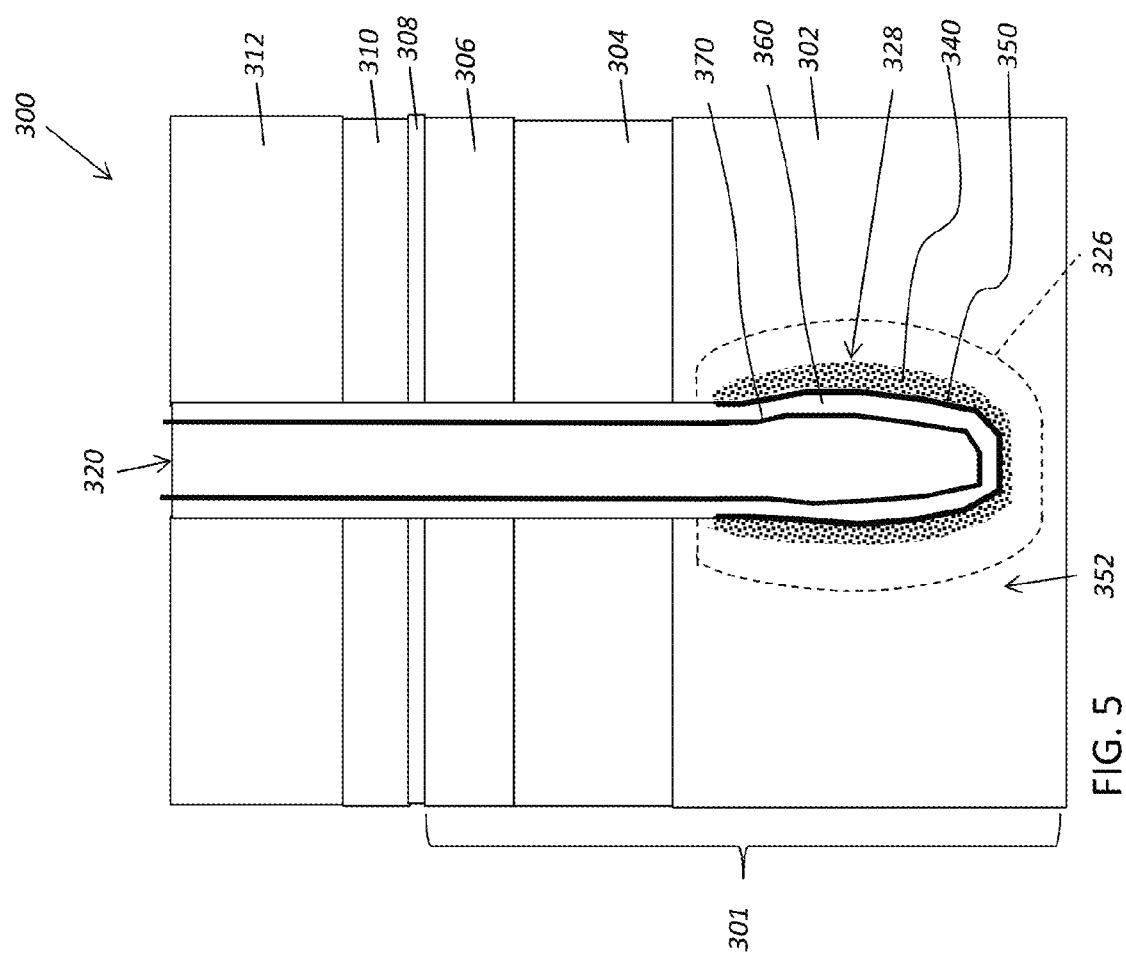

FIG. 5 shows one embodiment of a step of forming a metal-insulator-metal (MIM) stack within lower portion 328 of deep trench 320. Here, the MIM stack is formed according to conventional processes. In this case, etch resistant layer 330 (FIG. 4) may be removed by any conventional wet chemistry process, e.g., one that uses hydrofluoric acid (HF) as a base. Thereafter, a metal layer 350 may be formed over compressive stress layer 340 in the lower portion of the deep trench. In this embodiment, metal layer 350 may include any conventional DT capacitor metal including, e.g., tungsten (W), titanium (Ti), tantalum (Ta), ruthenium (Ru), cobalt (Co), copper (Cu), aluminum (Al), and may be deposited by any appropriate deposition technique such as CVD. In an alternative embodiment, metal layer 350 may include a silicide. In this case, metal layer 350 may be formed using any now known or later developed technique, e.g., performing an in-situ pre-clean, depositing a metal such as titanium (Ti), nickel (Ni), cobalt (Co), etc., annealing to have the metal react with silicon, and removing unreacted metal. Metal layer 350 in this case would extend into compressive stress layer 340. In any event, metal layer 350 couples via compressive stress layer 340, which is conductive as eSiGe or n-typed doped eSiGe, with buried plate 326 to form an outer electrode 352 of the DT capacitor. Since compressive stress layer 340 exists between substrate 302 and the deposited metal layer 350, residual oxides that may exist do not degrade the overall capacitance as in conventional processes.

As also shown in FIG. 5, a node dielectric layer 360 of a high-k dielectric material may be deposited throughout the inside of the lower portion of deep trench 320, and thus onto metal layer 350 (outer electrode). Examples of high-k material include but are not limited to metal oxides such as: silicon oxide ($SiO_2$), silicon nitride ($Si_3N_4$), silicon oxynitride (SiON), tantalum oxide ($Ta_2O_5$), barium titanate ($BaTiO_3$), hafnium oxide ($HfO_2$), zirconium oxide ($ZrO_2$), aluminum oxide ($Al_2O_3$). Others may include, for example, titanium oxide (TiOx), zirconium aluminum oxide (ZrAlOx), or metal silicates such as hafnium silicate (HfSixOy) or HfSixOyNz, where x, y, and z represent relative proportions, each greater than or equal to zero and x+y+z=1 (1 being the total relative mole quantity). Node dielectric layer 360 can be conventionally deposited by any appropriate technique such as ALD or CVD. The layer can have a substantially uniform thickness in a range of approximately 4 nm to approximately 20 nm. A second conformal, metal layer 370 (thick black line) is then deposited onto node dielectric layer 360. The material of metal layer 370 can include, for example: titanium nitride (TiN), tantalum nitride (TaN), titanium aluminum nitride (TiAlN), platinum (Pt), palladium (Pd), ruthenium (Ru), ruthenium oxide (RuOx), titanium (Ti), titanium silicon nitride (TiSiN) or a combination of these materials, and can be deposited by conventional techniques such as ALD or CVD. Metal layer 370 can function primarily as the second electrode for the capacitor.

Figure 6:
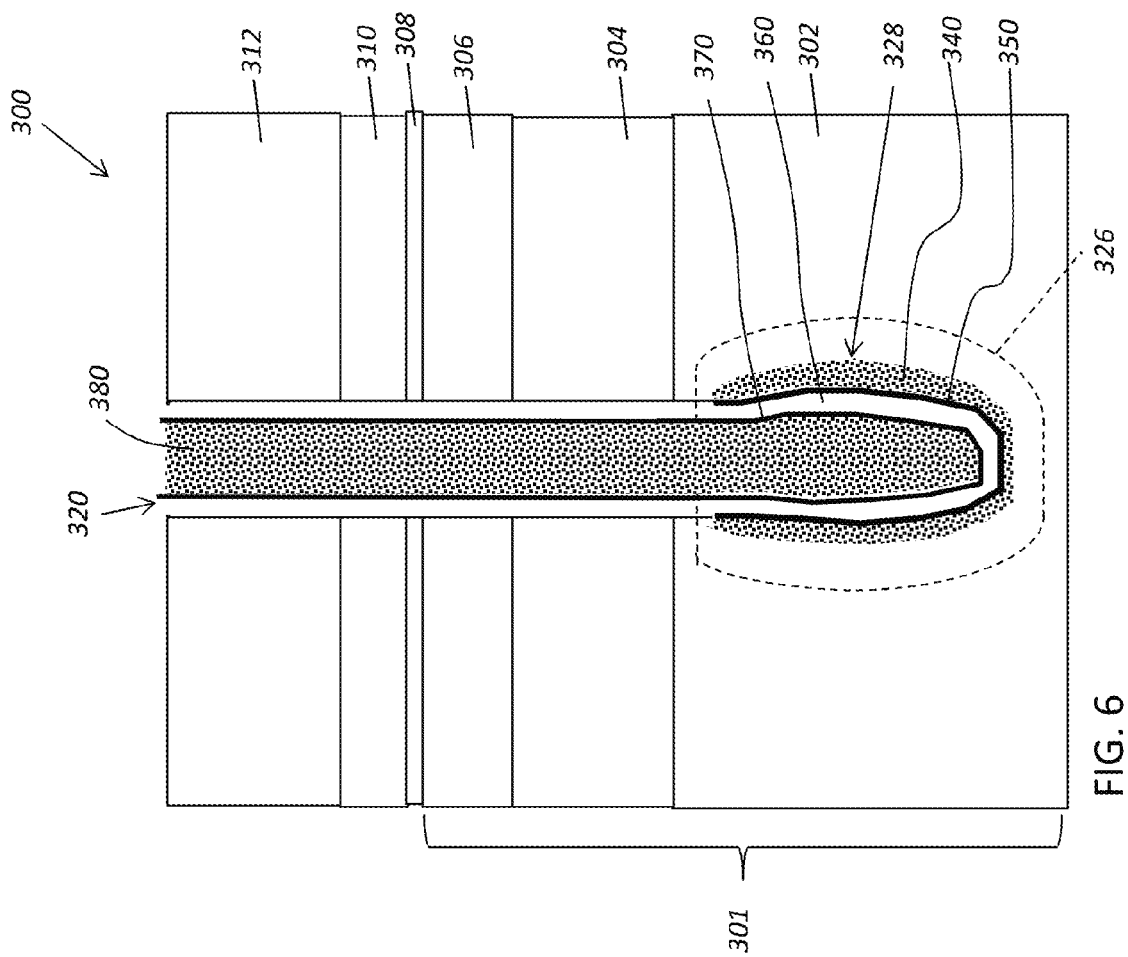

FIG. 6 shows filling a remaining portion of deep trench 320 with a semiconductor core 380. Semiconductor core 380 may include an epitaxial polysilicon germanium (epi polySiGe), which may include a compressive stress and/or an n-type dopant, similar to layer 340. Subsequent conventional processing steps (not shown) can then be performed such as formation of buried strap, logic (e.g., access transistor—see FIG. 9) and higher level Cu, W and Al metallization contacts, all not shown.

Figure 7:
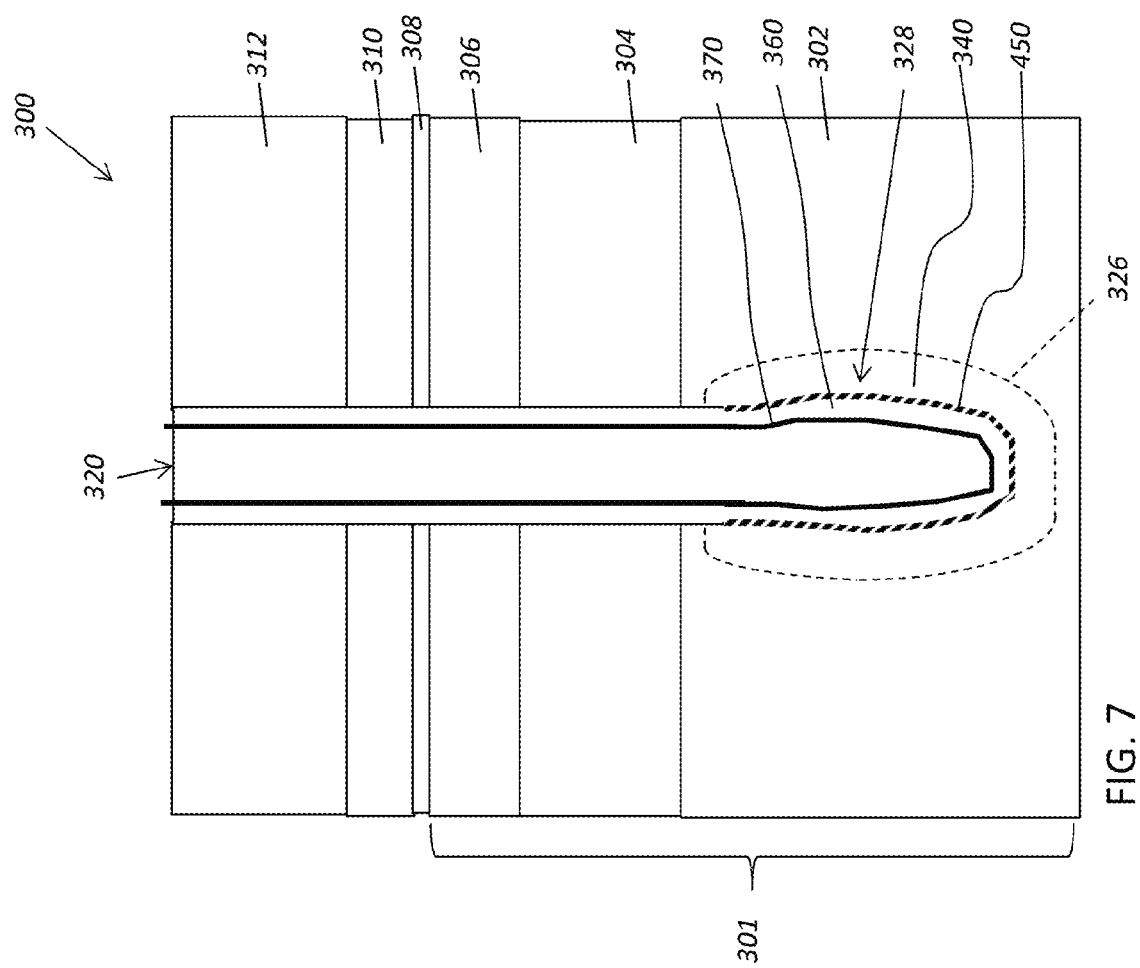

Referring to FIG. 7, another embodiment of the step of forming a metal-insulator-metal (MIM) stack within a portion, e.g., lower portion 328, of deep trench 320 is illustrated. In this case, compressive stress layer 340 is not present in lower portion 328 of deep trench 320. As before, etch resistant layer 330 (FIG. 4) may be removed by any conventional wet chemistry process that uses hydrofluoric acid (HF) as a base. Thereafter, a metal layer 450 may be formed over compressive stress layer 340. Here, however, the MIM stack is not formed according to conventional processes. Rather, the MIM stack forming includes co-depositing a refractory metal and silicon into lower portion 328 of deep trench 320 to form a silicide as an outer electrode, i.e., with buried plate 326 in substrate 302. That is, metal layer 450 includes silicide. "Refractory metal" may include but is not limited to: titanium (Ti), molybdenum (Mo), tantalum (Ta), cobalt (Co), tungsten (W), palladium (Pd), iridium (Ir). The silicidation process also varies from conventional annealing techniques in that it includes co-depositing, for example, by chemical vapor deposition (CVD), physical vapor deposition (PVD), atomic layer deposition (ALD), chemical oxidation, molecular beam epitaxy (MBE), or plating, the refractory metal and silicon to form the silicide. In contrast to conventional annealing techniques in which a metal is deposited and annealed and the silicide formed by consumption of the underlying silicon, the co-deposition provides a number of advantages. For example, as noted herein, silicide formation is known to create a tensile stress in DT capacitors. By co-depositing, for example, titanium and silicon, the amount of silicon can be adjusted to control the tensile stress of the outer electrode formed, i.e., with buried plate 326 in substrate 302. In addition, the co-deposition allows control of the amount of silicon consumed during the silicide formation. In one embodiment, the refractory metal and silicon may be alternately deposited to foster control of the process. In another embodiment, the co-deposition may also include deposition of germanium (Ge).

As also shown in FIG. 7, and as described above, node dielectric layer 360 of a high-k dielectric material may be deposited throughout the inside of deep trench 320, and thus onto metal layer 450. The same materials and deposition techniques as listed herein may be used here. As before, second conformal metal layer 370 (thick black line) of a conductive material is then deposited onto node dielectric layer 360. The same materials and deposition techniques as listed herein may be used here.

Figure 8:
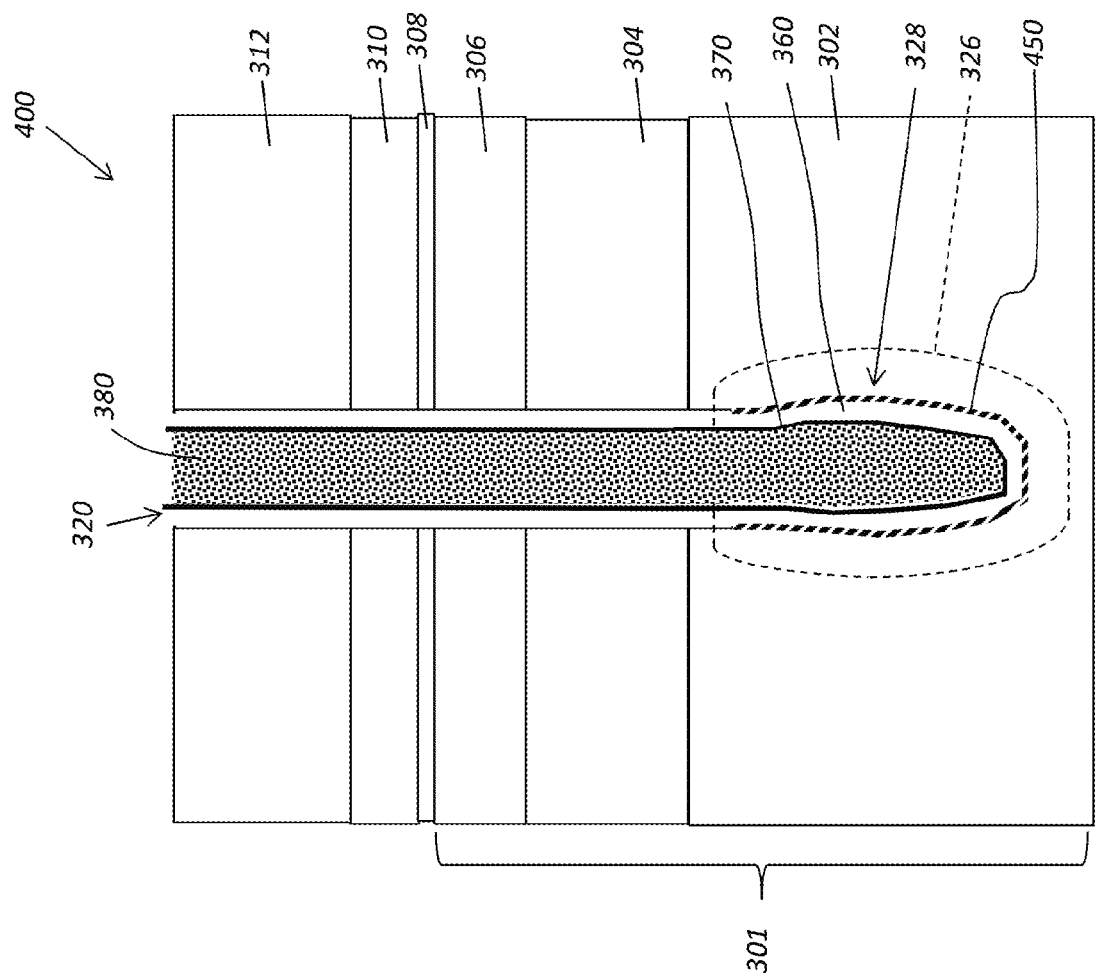

FIG. 8 shows filling a remaining portion of deep trench 320 with a semiconductor core 380. Semiconductor core 380 may include an epitaxial polysilicon germanium (epi poly-SiGe), which may include a compressive stress and/or an n-type dopant, similar to layer 340. Subsequent conventional processing steps (not shown) can then be performed such as formation of buried strap, logic (e.g., access transistor—see FIG. 9) and higher level Cu, W and Al metallization contacts, all not shown.

It is understood that while the processes of FIGS. 5-6 and 7-8 are described separately, the processes may be combined.

Figure 9:
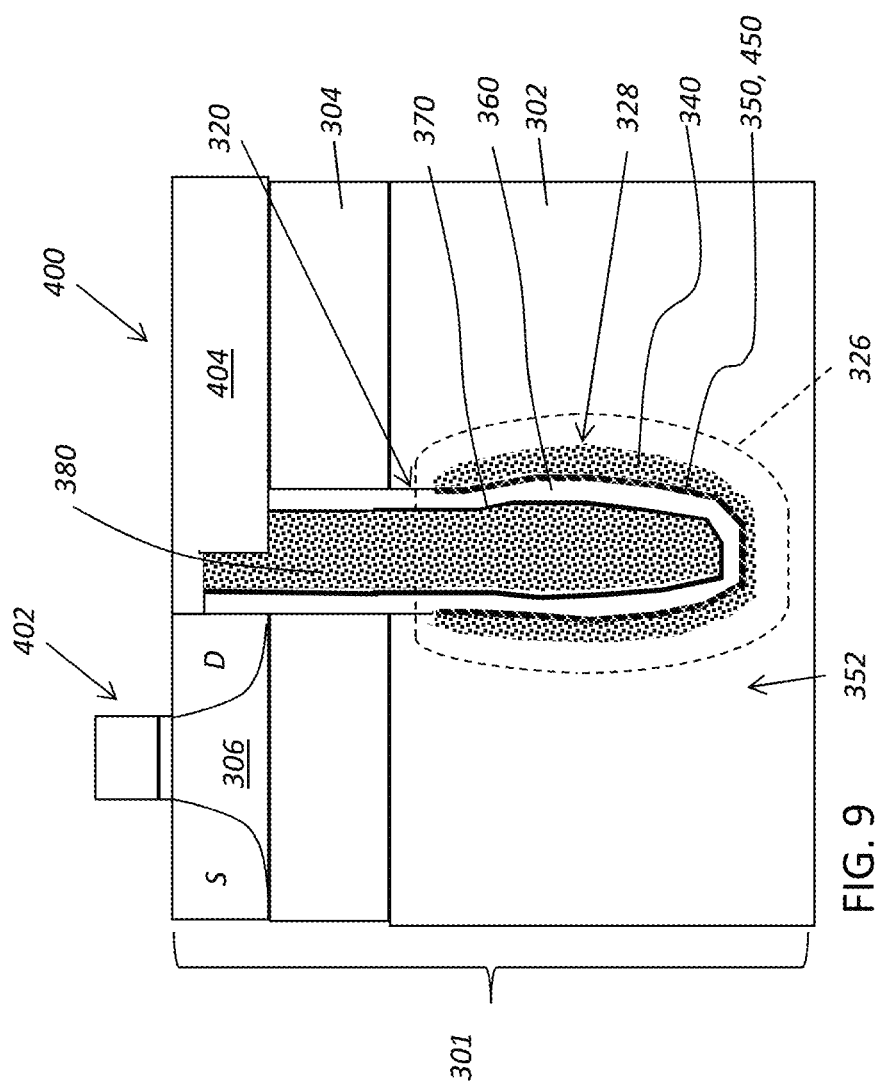

Turning to FIG. 9, embodiments of a DT capacitor 400 are illustrated. DT capacitor 400 includes a deep trench 320 in substrate 302, the deep trench including a lower portion 328 having a width that is wider than a width of the rest of the deep trench. Also shown is compressive stress layer 340 against substrate 302 in lower portion 328. Compressive stress layer 340 may include epitaxial silicon germanium including an n-type dopant. The MIM stack 350, 360, 370 is positioned over compressive stress layer 340 with MIM stack including node dielectric 360 between inner electrode 370 and outer electrode 350. As noted, outer electrode 450 may include a metal layer 350 (as in FIG. 6) of deposited metal, or a metal layer 450 including a silicide (as in FIG. 8). A semiconductor core 380 is positioned within the MIM stack. Semiconductor core 380 may include epitaxial polysilicon germanium including an n-type dopant. FIG. 9 also shows an access transistor 402 and STI 404, which may be provided to the embodiments of FIGS. 6 and 8 using conventional techniques, i.e., after removal of pad oxide 308, pad nitride 310 and mask 312.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A deep trench capacitor comprising:
 a deep trench in a substrate, the deep trench including a lower portion having a width that is wider than a width of the rest of the deep trench;
 a compressive stress layer directly against the substrate only in the lower portion;
 a metal-insulator-metal (MIM) stack over the compressive stress layer, the MIM stack including a node dielectric between an inner electrode of the MIM stack and an outer electrode of the MIM stack,
 wherein the outer electrode of the metal-insulator-metal (MIM) stack includes a metal layer only in the lower portion of the deep trench; and
 a semiconductor core within the MIM stack.

2. The deep trench capacitor of claim 1, wherein the outer electrode includes silicide.

3. The deep trench capacitor of claim 1, wherein the compressive stress layer includes epitaxial silicon germanium including an n-type dopant, and the semiconductor core includes epitaxial polysilicon germanium including an n-type dopant.

4. A deep trench capacitor comprising:
 a deep trench in a substrate, the deep trench including a lower portion having a width that is wider than a width of the rest of the deep trench;
 a compressive stress layer directly against the substrate only in the lower portion;
 a metal-insulator-metal (MIM) stack over the compressive stress layer, the MIM stack including a node dielectric between an inner electrode of the MIM stack and an outer electrode of the MIM stack,
 wherein the outer electrode of the metal-insulator-metal (MIM) stack includes a metal layer, the metal layer being in direct contact with the compressive stress layer; and
 a semiconductor core within the MIM stack.

* * * * *